United States Patent [19]

Otaka

[11] Patent Number: 5,583,429
[45] Date of Patent: Dec. 10, 1996

[54] CURRENT DETECTION DEVICE

[75] Inventor: Michihiro Otaka, Shizuoka, Japan

[73] Assignee: Yazaki Corporation, Tokyo, Japan

[21] Appl. No.: 419,983

[22] Filed: Apr. 11, 1995

[30] Foreign Application Priority Data

Apr. 14, 1994 [JP] Japan ................ 6-076188

[51] Int. Cl.[6] .................................................. G01R 1/20
[52] U.S. Cl. .............. 324/127; 324/117 H; 336/175; 336/174
[58] Field of Search .................. 324/126, 117 R, 324/117 H, 127; 336/83, 175, 174

[56] References Cited

U.S. PATENT DOCUMENTS

| | | | |
|---|---|---|---|
| 3,646,440 | 2/1972 | Wilhelm | 324/126 |
| 5,066,904 | 11/1991 | Bullock | 324/126 |
| 5,349,288 | 9/1994 | Miller | 324/126 |
| 5,467,013 | 11/1995 | Williams | 324/126 |

FOREIGN PATENT DOCUMENTS

| | | | |
|---|---|---|---|
| 54-130069 | 10/1979 | Japan | G01R 15/02 |
| 64-66563 | 3/1989 | Japan | G01R 15/02 |
| 383418 | 8/1991 | Japan | H02G 3/16 |
| 4102067 | 4/1992 | Japan | G01R 15/02 |

Primary Examiner—Kenneth A. Wieder
Assistant Examiner—Jose M. Solis
Attorney, Agent, or Firm—Sughrue, Mion, Zinn, Macpeak & Seas

[57] ABSTRACT

Electric current, flowing through a penetration conductor extending through a main housing, is detected by a non-contact current detection unit incorporated in the main housing. Connector housings are provided respectively at those portions of opposite sides of the main housing through which the penetration conductor extends, and opposite end portions of the penetration conductor as connector terminals are disposed within the connector housings, respectively. Each of the connector housings and the associated connector terminal received therein jointly constitute a connector.

4 Claims, 6 Drawing Sheets

CURRENT DETECTION DEVICE

BACKGROUND OF THE INVENTION

The present invention relates to a current detection device for detecting electric current flowing through a conductor, for example, in a branch connection box in a vehicle.

FIGS. 7 and 8 show a conventional current detection device of the type described. As shown in these Figures, the current detection device includes a main housing 1 of a rectangular configuration, and a tubular portion 2, formed on the bottom of the housing 1, that extends in an upward-downward direction, the tubular portion 2 having a bore 3 of a rectangular cross-section extending through the housing 1. A penetration conductor 4, comprising a bus bar through which current to be measured flows, is passed upwardly through the bore 3, with an upper end portion thereof projecting upwardly beyond the main housing 1.

One end portion of a conductor 5 comprising a bus bar is mated with the upper end portion of the penetration conductor 4 which projects upwardly beyond the main housing 1, and is fastened thereto by a bolt 8 (which has a special head) and a nut 9 through washers 6 and 7.

A magnetic core 10 having a C-shape is mounted on the outer periphery of the tubular portion 2 within the main housing 1, and a magneto-electric conversion element 11 comprising a Hall element is provided in a gap 10A in the magnetic core 10. This magneto-electric conversion element 11 extends upright from a circuit board 12 within the main housing 1. An amplifier circuit 13 and so on are mounted on the circuit board 12, and a connector 14 for taking out a detection output and for feeding power to the amplifier circuit 13 is also provided. Although not shown in the drawings, there is provided printed wiring for providing a path from the magneto-electric element 11 to the connector 14 via the amplifier circuit 13. A provisional retainer 15 is used for provisionally retaining the magnetic core 10.

The magnetic core 10, the magneto-electric conversion element 11, the circuit board 12, the amplifier circuit 13, the connector 14, the provisional retainer 15, etc. jointly constitute a non-contact current detection unit 16.

In such a conventional current detection device, however, the special bolt 8, used for connecting the penetration conductor 4 has seven radial grooves 8A formed in its head the other conductor 5, and therefore, a problem has arisen in that the fastening operation can not be effected without a special driver. Another problem is that time and labor are required for the fastening operation since either the bolt 8 or the nut 9 need to be rotated a plurality of times.

A further problem is that time and labor are required for creating a hole 4A through the penetration conductor 4 for passing the bolt 8 through this hole.

SUMMARY OF THE INVENTION

It is an object of the present invention to provide a current detection device by which connection of a penetration conductor can be made easily and efficiently without the use of a special tool.

The above object has been achieved by a current detection device according to a first aspect of the invention wherein electric current, flowing through a penetration conductor extending through a main housing, is detected by a current detection unit incorporated in the main housing; connector housings are provided respectively at those portions of opposite sides of the main housing through which the penetration conductor extends; opposite end portions of the penetration conductor, functional as connector terminals, are disposed respectively within the connector housings; and each of the connector housings cooperates with the associated connector terminal disposed therein to constitute a connector for connecting the penetration conductor to a mating conductor.

The above object has also been achieved by a current detection device according to a second aspect of the invention wherein electric current, flowing through a penetration conductor extending through a main housing, is detected by a current detection unit incorporated in the main housing; connector housings are provided respectively at those portions of opposite sides of the main housing through which the penetration conductor extends; each of the main housing and the connector housings is constituted by a shielded conductor; opposite end portions of the penetration conductor, functional as connector terminals, are disposed respectively within the connector housings; and each of the connector housings cooperates with the associated connector terminal disposed therein to constitute a connector for connecting the penetration conductor to a mating conductor.

With the construction according to the first and second aspects of the present invention, the penetration conductor can be connected to the mating conductors. Using connectors each comprising the associated connector terminal (which is defined by the end portion of this penetration conductor) and the associated connector housing receiving this connector terminal. Therefore connection of the penetration conductor can be carried out easily and efficiently without a special tool as used in the conventional device.

Further, according to the second aspect of the present invention, each of the main housing and the connector housings is constituted by a shielded conductor, and the current detection unit is incorporated in the main housing. With this construction, even if the conductors for measuring current comprise shield-type conductors, the measurement of the current can be carried out while maintaining their shielded condition.

DETAILED DESCRIPTION OF THE PREFERRED EMBODIMENTS

Preferred embodiments of the present invention will now be described in detail with reference to the accompanying drawings.

Figure 7:
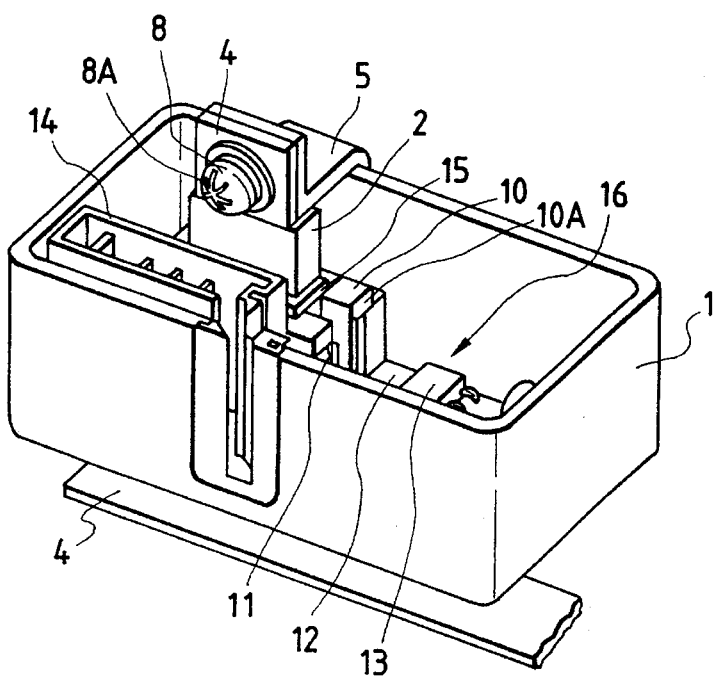
FIG. 7 is a perspective view of a conventional current detection device.
Figure 8:
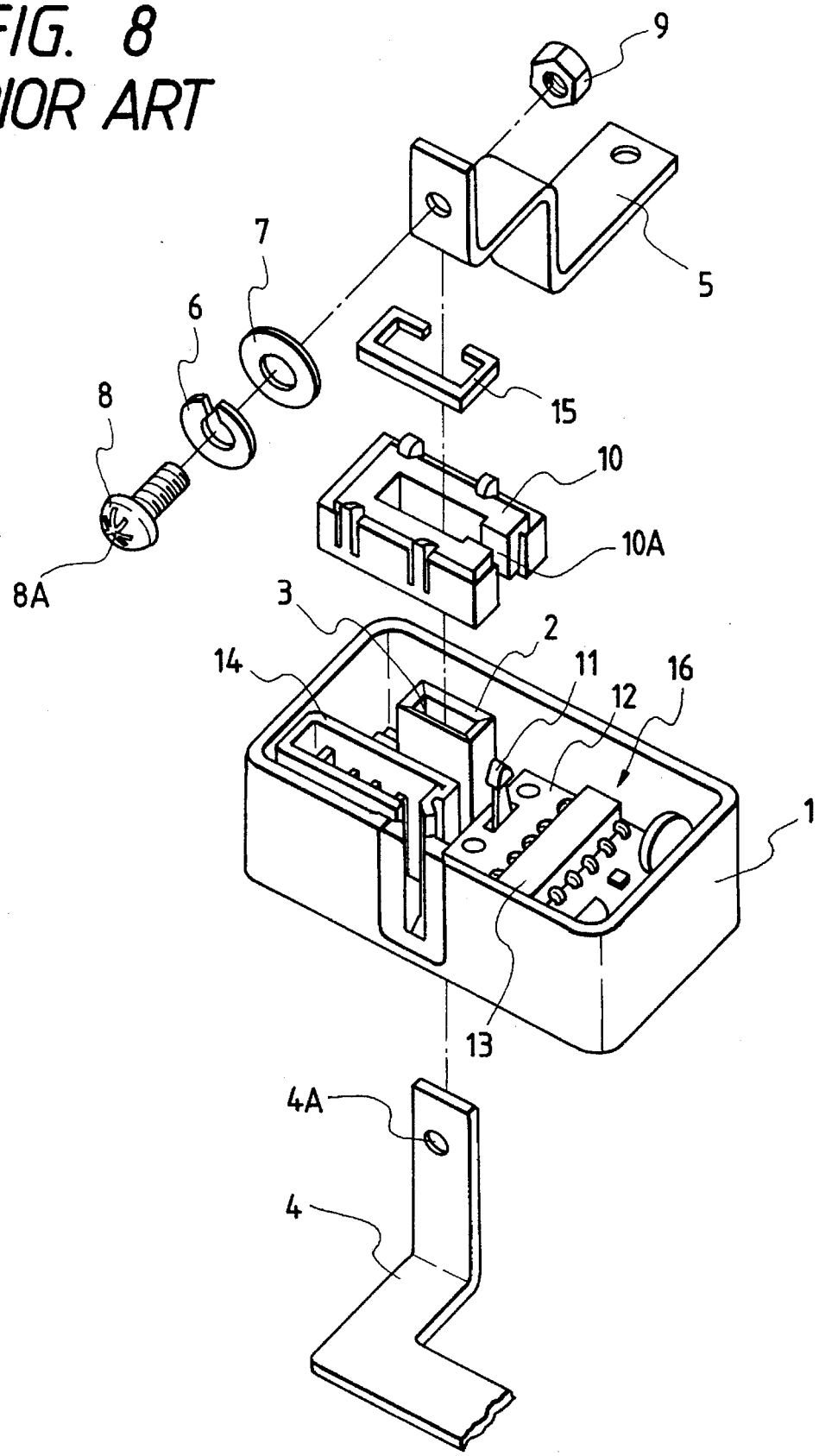
FIG. 8 is an exploded perspective view of the conventional current detection device of FIG. 7.

Like reference numerals commonly used in the above-mentioned FIGS. 7 and 8 and the embodiments below denote like parts.

Figure 1:
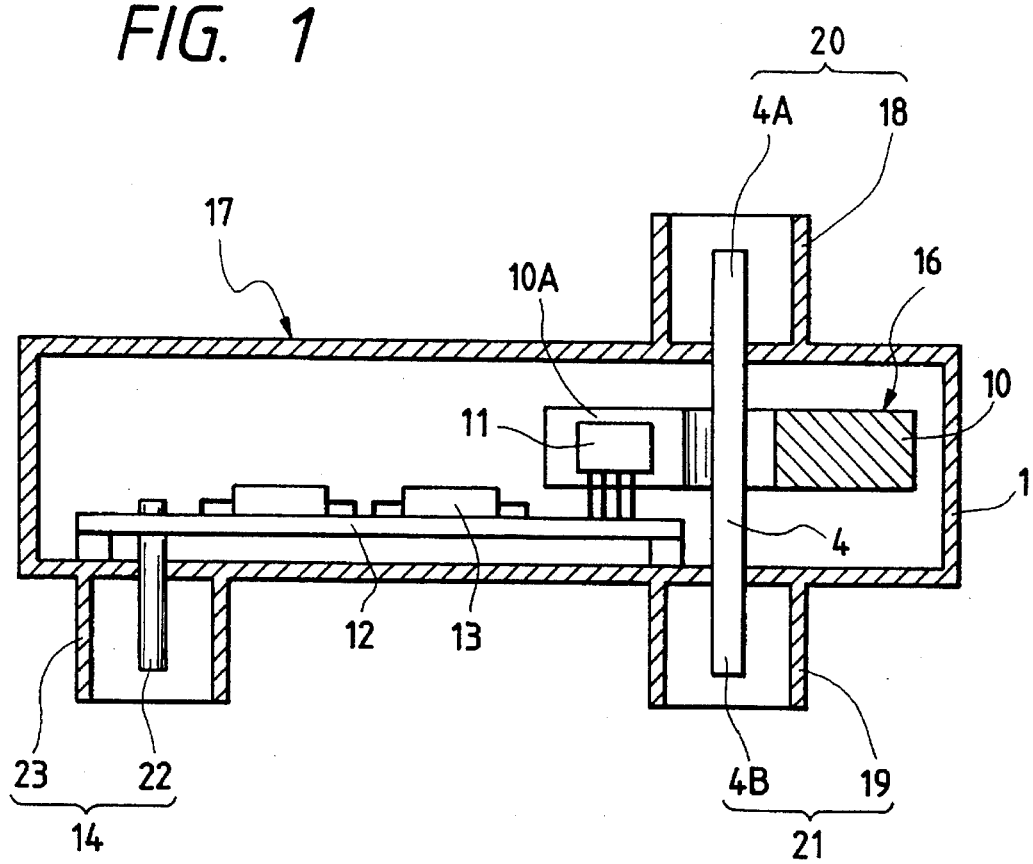
FIG. 1 is a vertical cross-sectional view of a first embodiment of a current detection device of the invention.
Figure 2:
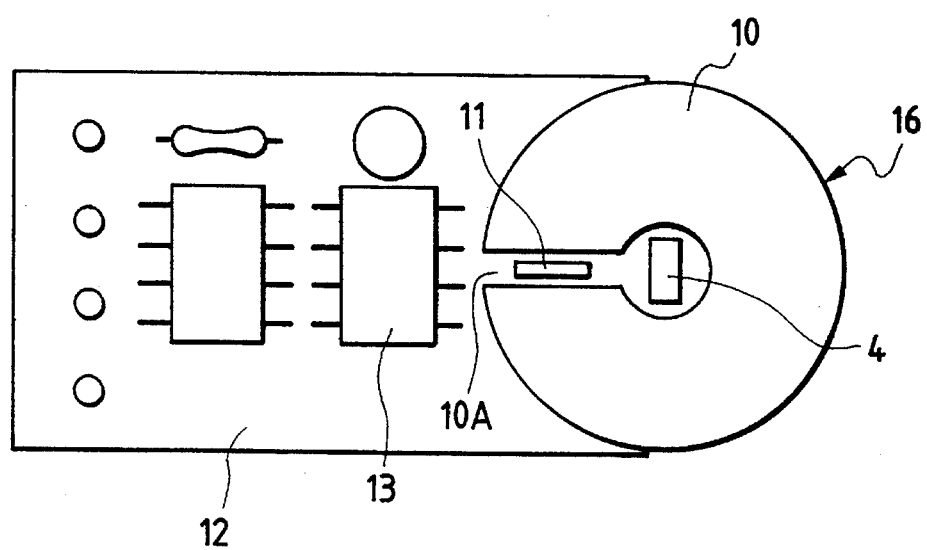
FIG. 2 is a plan view of a current detection unit used in the device of FIG. 1.

FIGS. 1 and 2 show a first embodiment of the present invention.

In a current detection device 17 of this embodiment, a penetration conductor 4, through which electric current to be measured flows, extends through and is supported by a main housing 1 such that opposite end portions of the penetration conductor 4 project respectively beyond upper and lower sides of the main housing 1. Connector housings 18 and 19 are integrally formed on and project from the upper and lower surfaces of the main housing 1 (through which the penetration conductor 4 extends), respectively. The opposite end portions of the penetration conductor 4 which serve respectively as connector terminals 4A and 4B are received in the connector housings 18 and 19, respectively. The connector housing 18 and the connector terminal 4A jointly constitute a connector 20, and the connector housing 19 and the connector terminal 4B jointly constitute a connector 21, the connectors 20 and 21 serving to connect the penetration conductor 4 to other conductors.

A connector 14 for taking out a detection output from a circuit board 12 and for feeding power to an amplifier circuit 13 comprises a connector terminal 22 which is mounted perpendicularly on the circuit board 12 and projects beyond the lower surface of the main housing 1, and a connector housing 23 is integrally formed perpendicularly on the lower surface of the main housing 1 to receive the connector terminal 22 therein.

Figure 3:
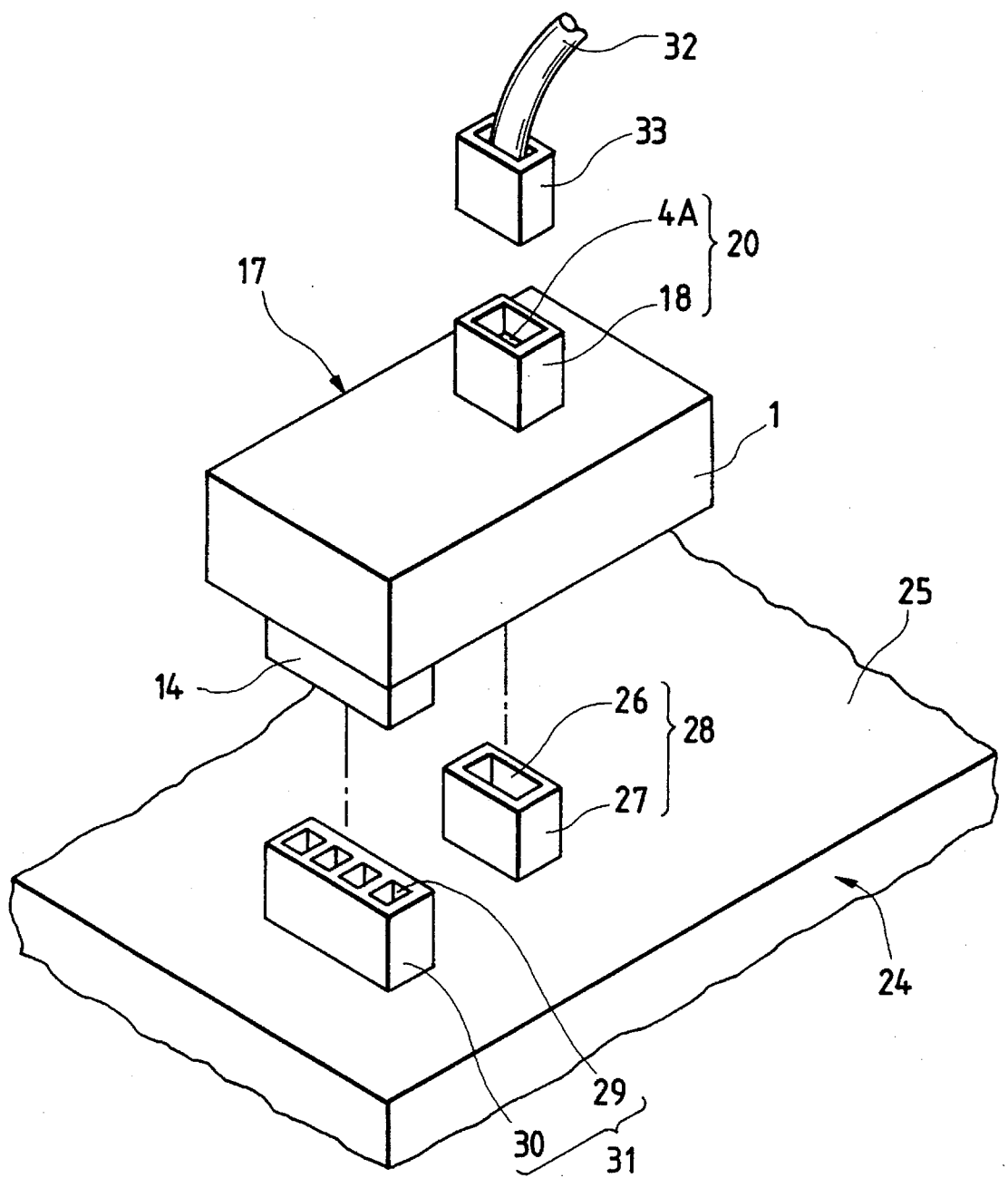
FIG. 3 is a perspective view showing one example of the relation between the current detection device of FIG. 1 and a branch connection box to be connected thereto.

FIG. 3 shows one example of the relation between the above current detection device 17 and a branch connection box 24 to which this current detection device is connected. The branch connection box 24 comprises a main housing 25, and a connector 28 disposed on an upper surface of the main housing 25 corresponding to the connector 21 of the current detection device 17, the connector 28 comprising a connector terminal 26 for a conductor through which electric current to be measured flows, and a connector housing 27 receiving the connector terminal 26. A connector 31 for connection to the connector 14 is mounted on the upper surface of the main housing 25, and comprises a connector terminal 29 and a connector housing 30 receiving the connector terminal 29.

With this arrangement, the current detection device 17 can be connected to the branch connection box 24 easily and efficiently by connecting the connectors 14 and 21 respectively to the connectors 31 and 28. Thus, the connecting operation can be carried out without a special tool as used in the conventional construction.

A connector 33 of a power cable 32 is connected to the connector 20 of the current detection device 17.

The positions of the connectors 14, 20 and 21 on the main housing 1 are not limited to those shown in the above embodiment, and these connectors can be provided at any suitable position such as a side surface of the main housing 1 if necessary.

Also, the connector 14 may be formed on the upper surface of the main housing 1 so that it can be connected not to the branch connection box 24 but to a connector of a wire harness (not shown).

Figure 4:
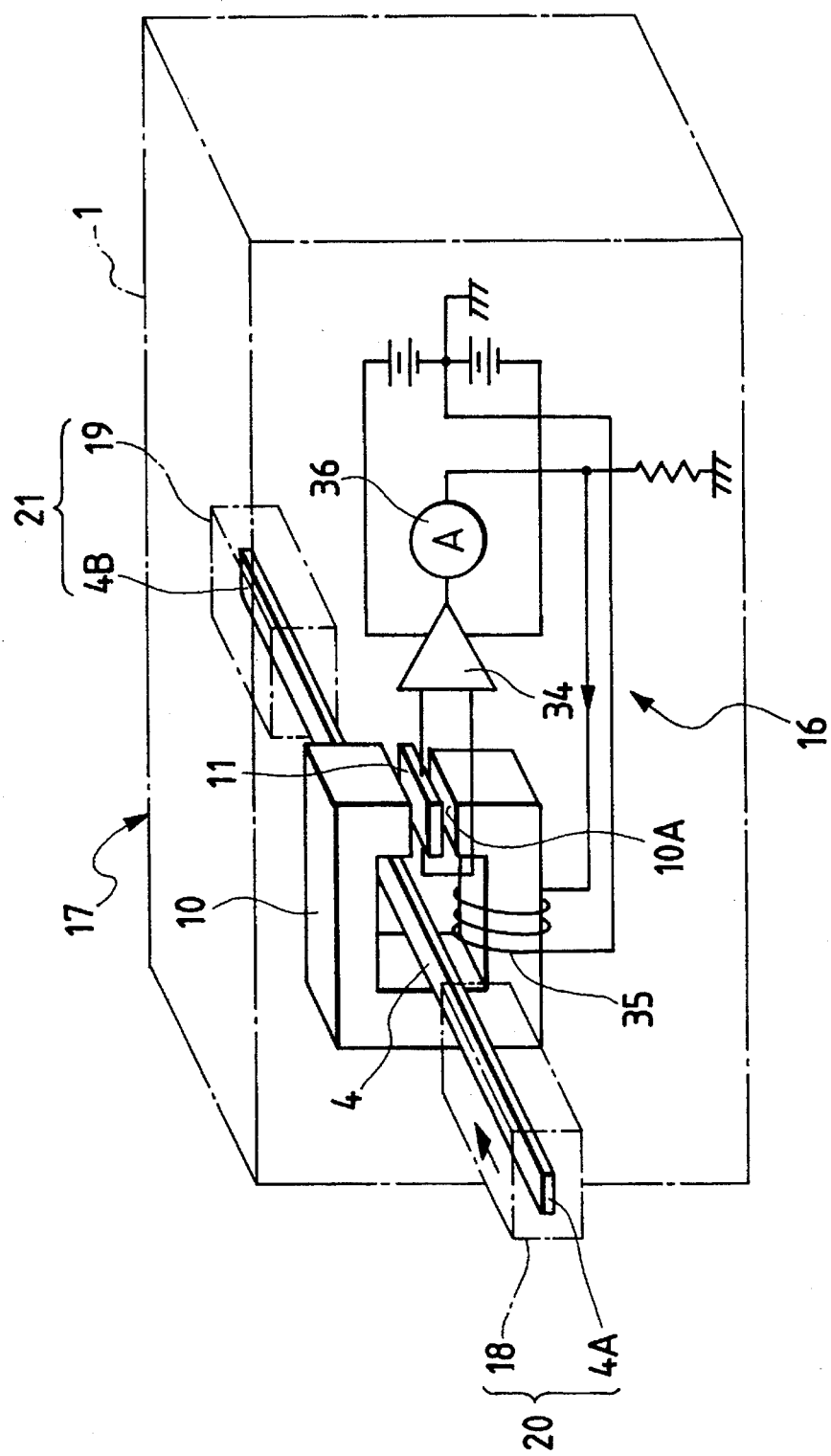
FIG. 4 is a perspective view of a second embodiment of a current detection device of the invention.

FIG. 4 shows a second embodiment of the present invention.

The current detection device 17 of this embodiment differs from that of the first embodiment in that a non-contact current detection unit 16 is constituted by a zero flux-type circuit. This zero flux-type current detection unit 16 is identical to the first embodiment in that a C-shaped magnetic core 10 is mounted around a penetration conductor 4 comprising a bus bar, that a magneto-electric conversion element 11 comprising a Hall element is provided in a gap 10A in the C-shaped magnetic core 10, and that connectors 20 and 21 for connection to their respective mating conductors are mounted at opposite end portions of the penetration conductor 4, respectively.

In this zero flux-type current detection unit 16, a magnetic flux, produced by electric current flowing through the penetration conductor 4 extending through the magnetic core 10, is absorbed by the magnetic core 10, and the flux in the magnetic core 10 is converted to a voltage signal by the magneto-electric conversion element 11 comprising a Hall element, and this voltage signal is amplified by an amplifier circuit 34, and an amplification output of the amplifier circuit 34 is caused to flow through a feedback coil 35 wound on the magnetic core 10, thereby producing a flux in a direction opposite to the direction of the flux which is produced by the current to be measured, and passes through the magnetic core 10. By doing so, the gain of a feedback circuit constituted by the magnetic core 10, the magneto-electric conversion element 11, the amplifier circuit 34 and the feedback coil 35 is made large enough to balance the flux produced by the current to be measured, with the flux generated from the feedback coil 35 by the magneto-electric conversion element 11. When a balance between these fluxes is established, that is, a zero-cross is achieved, electric current flowing through the feedback coil 35 is measured by a measuring instrument 36, thereby measuring the current to be measured.

With this construction, similar effects as achieved in the first embodiment can be achieved through the connector connection.

Figure 5:
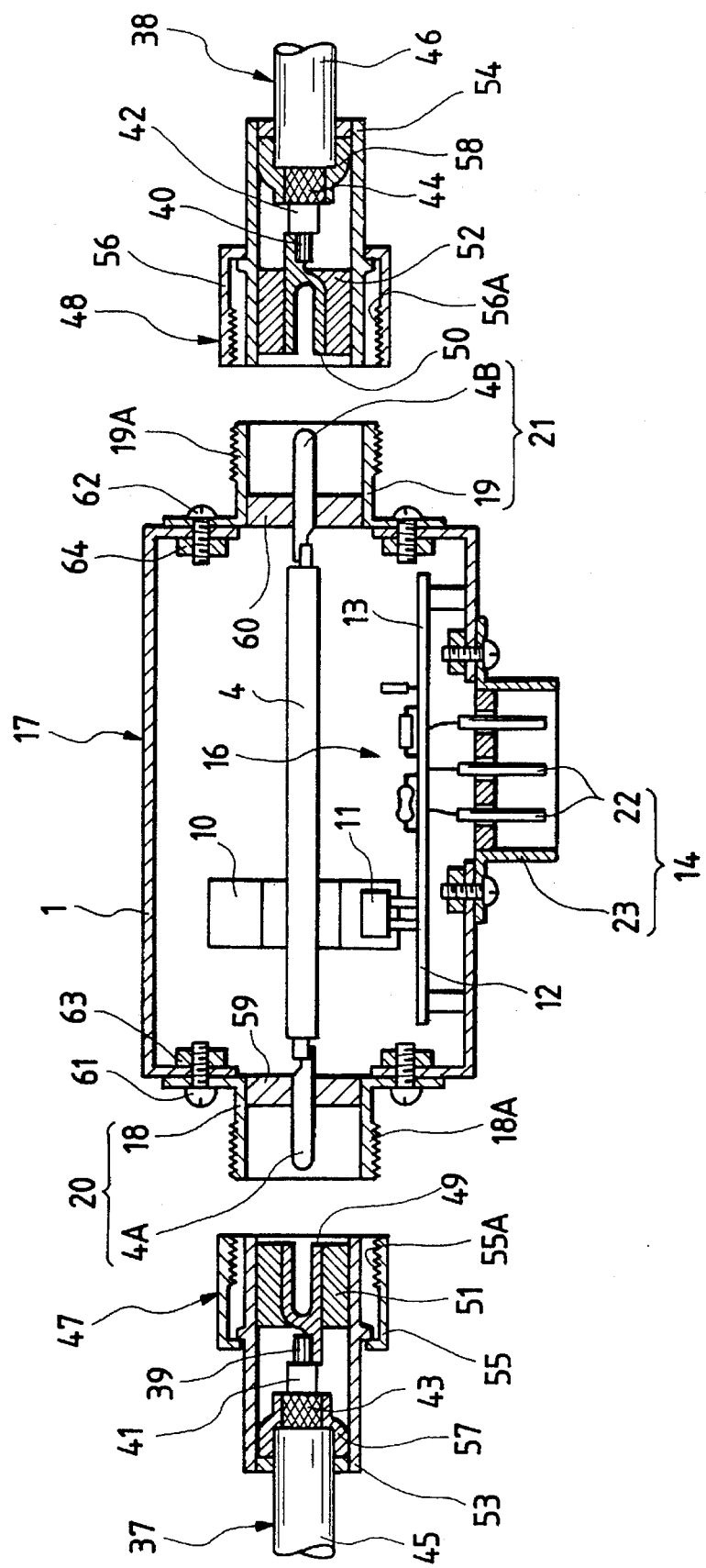
FIG. 5 is a vertical cross-sectional view of a third embodiment of the invention.
Figure 6:
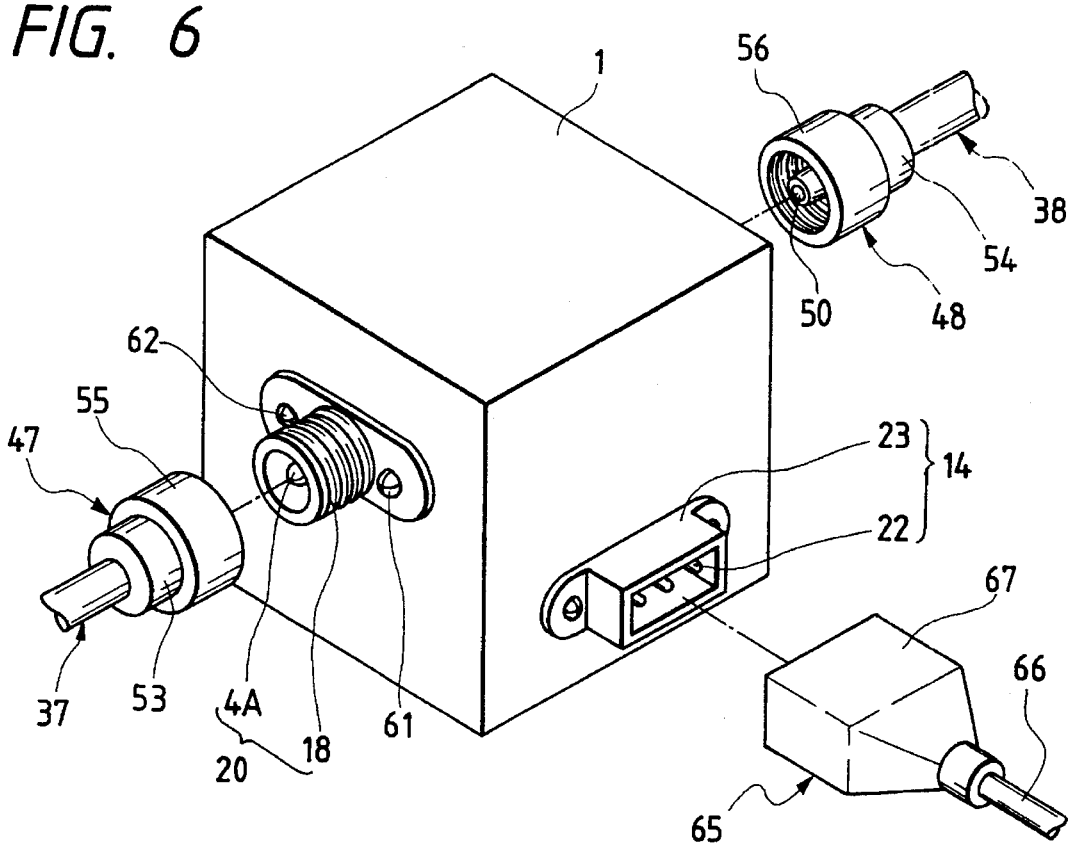
FIG. 6 is a perspective view of the device of FIG. 5.

FIGS. 5 and 6 show a third embodiment of the present invention.

The current detection device 17 of this embodiment is a modified form of the second embodiment in which the non-contact current detection unit 16 is constituted by a zero flux-type circuit.

In this embodiment, the present invention is applied to the current detection device 17 of the type in which conductors for connection respectively to connectors 20 and 21 comprise shielded wires (that is, shield-type conductors) 37 and 38, respectively. The shielded wire 37, 38 has an insulating layer 41, 42, a shield layer 43, 44 and an insulating sheath 45, 46 sequentially wound on a conductor 39, 40.

Shielded connectors 47 and 48 are connected to ends of these shielded wires 37 and 38, respectively. The shielded connector 47, 48 comprises a female connector terminal 49, 50 connected to one end of the conductor 39, 40 by soldering or compressive clamping, a shield connector housing 53, 54 of metal mounted on the outer periphery of this female connector terminal through an insulative support member 51, 52, a tubular connecting metal member 55, 56 rotatably mounted on the outer periphery of the shield connector housing 53, 54 but retained against disengagement, and an internally-threaded connecting portion 55A, 56A formed on an inner surface of a distal end portion of the connecting metal member 55, 56, and a shield connecting member 57, 58 electrically connecting the shield connector housing 53, 54 to the shield layer 43, 44. The shield connecting member 57, 58 is connected to the shield layer 43, 44 and the shield connector housing 53, 54 by soldering or the like.

Thus, the current detection device 17 is of the shielded type since the shielded wires 37 and 38 are used. Namely, a main housing 1, as well as connector housings 18 and 19 of the connectors 20 and 21 provided respectively at the opposite ends of the main housing 1, are constituted by a shielded conductor of metal.

In the connectors 20 and 21, connector terminals 4A and 4B comprise respective male conductors different from the penetration conductor 4. The connector terminals 4A and 4B are connected respectively to the opposite ends of the penetration conductor 4 by soldering or the like. The connector housing 18, 19 is supported around the connector terminal 4A, 4B through an insulative support member 59, 60. An externally-threaded connecting portion 18A, 19A is formed on an outer periphery of a distal end portion of the connector housing 18, 19. The connector housing 18, 19 of this construction is fixedly secured to the main housing 1 by bolts 61, 62 and nuts 63, 64.

A connector housing 23 of a connector 14 is also constituted by a shielded conductor. A wire for connection to the connector 14 through a connector 65 is also constituted by a shielded wire 66. A housing of the connector 65 is constituted by a shield connector housing 67 of metal.

With this construction, even if the conductors for measuring electric current are constituted by the shielded wires 37 and 38, the measurement of the electric current can be carried out while maintaining their shielded condition.

As described above, in the current detection devices of the invention, the following excellent effects can be obtained.

According to the first and second aspects of the present invention, connector housings are provided at those portions of the opposite sides of the main housing through which the penetration conductor extends, the opposite end portions of the penetration conductor functioning as the connector terminals are disposed respectively within the connector housings, and each of the connector housings cooperates with the associated connector terminal disposed therein to constitute the connector for connecting the penetration conductor to the mating conductor. Therefore, the connection of the penetration conductor can be carried out easily and efficiently without a special tool as used in conventional devices.

According to the second aspect of the present invention, each of the main housing and the connector housings is constituted by a shielded conductor, and the current detection unit is incorporated in the main housing. With this construction, even if the conductors for measuring current are shield-type conductors, the measurement of the current can be carried out while maintaining their shielded condition.

What is claimed is:

1. A current detection device, comprising:

a main housing;

a penetration conductor extending through said main housing;

a current detection unit incorporated in said main housing for detecting electric current flowing through said penetration conductor;

connector housings provided respectively at opposite sides of said main housing through which said penetration conductor extends; and connector terminals formed of opposite end portions of said penetration conductor disposed respectively within said connector housings;

wherein each said connector housing and said connector terminal disposed therein constitutes connector for connecting said penetration conductor to a mating conductor.

2. A current detection device as claimed in claim 1, wherein each of said main housing and said connector housings is constituted by a shielded conductor.

3. A current detection device as claimed in claim 1, wherein said current detection unit is a non-contact current detection unit constituted by a zero flux-type circuit.

4. A current detection device as claimed in claim 2, further comprising insulative support members for supporting said connector housings around said connector terminals.

* * * * *